United States Patent [19]
Suzuki et al.

[11] 4,374,685
[45] Feb. 22, 1983

[54] METHOD OF MAKING A COATED CUTTING TIP

[75] Inventors: Junichiro Suzuki; Hiroshi Tanaka, both of Aichi, Japan

[73] Assignee: NGK Spark Plug Co., Ltd., Aichi, Japan

[21] Appl. No.: 278,038

[22] Filed: Jun. 29, 1981

[30] Foreign Application Priority Data

Jul. 2, 1980 [JP] Japan .................. 55-90348

[51] Int. Cl.³ .................. B22F 3/24; B22F 7/02
[52] U.S. Cl. .................. 148/126.1; 75/238; 75/240; 428/547
[58] Field of Search .......... 148/126; 75/238, 208 R, 75/224, 204, 205, 235, 240; 427/249, 253

[56] References Cited

U.S. PATENT DOCUMENTS

| | | | |
|---|---|---|---|
| Re. 29,420 | 9/1977 | Lindstrom | 148/126 |
| 3,955,038 | 5/1976 | Lindstrom | 427/249 |
| 3,994,692 | 11/1976 | Rudy | 148/126 |
| 4,018,631 | 4/1977 | Hale | 427/249 |
| 4,180,400 | 12/1979 | Smith | 427/253 |
| 4,212,671 | 7/1980 | Ettmayer | 75/238 |
| 4,282,289 | 4/1980 | Kullander | 427/249 |

FOREIGN PATENT DOCUMENTS

| | | | |
|---|---|---|---|
| 2253745 | 5/1973 | Fed. Rep. of Germany . | |
| 53-2717842 | 10/1978 | Japan . | |
| 55-8485 | 1/1980 | Japan | 75/238 |
| 55-152174 | 11/1980 | Japan . | |

Primary Examiner—L. Dewayne Rutledge
Assistant Examiner—J. J. Zimmerman
Attorney, Agent, or Firm—Sughrue, Mion, Zinn, Macpeak & Seas

[57] ABSTRACT

A method of making a coated tip for cutting purposes having a lower degree of flank and crater wear and reduced chipping. A WC-based ultrahard alloy containing WC, at least one nitride selected from among TiN, TaN and NbN and a bonding metal is heat treated at a temperature of 800° C. to 1,300° C. in a nitrogen atmosphere for a sufficiently long period of time to cause nitride in a layer in the vicinity of the surface of the alloy to move to the surface to form a layer of nitride thereon as well as an alloy layer of WC and the bonding metal in which the nitride has been reduced. The surface of the tip is then coated with a layer of $Al_2O_3$.

4 Claims, No Drawings

METHOD OF MAKING A COATED CUTTING TIP

BACKGROUND OF THE INVENTION

The present invention relates to a method of making a WC-based coated tip having a high cutting performance.

There has been previously known a coated tip used for cutting purposes which is composed of a WC-based ultrahard alloy, and TiC, TiN, $Al_2O_3$ or the like applied by vapor phase deposition to the surface of the alloy to improve its wear resistance. A decarburized layer formed in the matrix, namely the WC-based ultrahard alloy, during the vapor phase deposition of TiC or like material, however, renders the matrix brittle. It also reduces the bonding strength of the coated material to the extent that it can easily be peeled off the tip during a cutting operation involving a high percussive force.

SUMMARY OF THE INVENTION

The invention eliminates the aforesaid drawbacks, and provides a method of making a coated tip for cutting purposes which is superior both in bonding strength and in wear resistance. More specifically, the invention provides a method of making a coated tip for cutting purposes, which includes the steps of heat treating a WC-based ultrahard alloy containing WC, at least one nitride selected from among TiN, TaN and NbN, and a bonding metal at a temperature of 800° C. to 1,300° C. in an atmosphere containing nitrogen to cause the nitride in a layer in the vicinity of the surface of the alloy to move to the alloy surface to form a layer of the nitride on the alloy surface and an alloy layer of the WC and bonding metal in which the nitride has been reduced, and coating the surface of the nitride layer with a layer of $Al_2O_3$. Preferably, the nitride layer has a thickness of 1 to 8µ, the $Al_2O_3$ layer has a thickness of 1 to 5µ, the nitride and $Al_2O_3$ layers have a total thickness of 2 to 10µ.

If the thickness of the nitride layer is smaller than 1µ, it fails to provide an effective bonding layer, while if it is greater than 8µ, a heavy grain growth in the nitride layer reduces its strength and the $Al_2O_3$ layer will fail to provide a satisfactory improvement in heat resistance. If the $Al_2O_3$ layer has a thickness which is smaller than 1 µ, it does not provide a satisfactory wear resistance. If its thickness is greater than 5µ, it is likely to peel off the nitride layer due to the different coefficients of thermal expansion between he two layers. A prolonged period of deposition brings about the growth of $Al_2O_3$ grains with a resultant reduction in the strength and wear resistance of the $Al_2O_3$ layer. If the two coated layers have a total thickness which is smaller than 2 µ, they do not greatly contribute to improving the cutting performance of the tip. If their combined thickness is greater than 10µ, however, they are likely to peel off the matrix due to their different coefficients of thermal expansion and the strength of the matrix is, therefore, reduced.

According to the invention, at least one of TiN, TaN and NbN is caused to move toward the surface of the matrix during its heat treatment, as hereinbefore set forth. A strong layer of WC and the bonding metal, which contains a reduced quantity of any such nitride, is formed in a region slightly inwardly of the alloy surface. The nitride has a concentration which increases continuously toward the alloy surface, and the alloy surface is covered with a layer of TiN, TaN or NbN, or a solid solution thereof. The nitride layer thus formed on the alloy surface has a thickness of 1 to 8µ.

It is important to heat treat the alloy at a temperature in the range of 800° C. to 1,300° C. At a temperature which is lower than 800° C., no effective movement of any such nitride can take place, and it takes the nitride a long time to move toward the matrix surface. If, on the other hand, the matrix is heated at a temperature exceeding 1,300° C., the growth of crystals therein leads to a reduction in the mechanical strength of the matrix. The matrix is then placed in a reaction vessel for vapor phase deposition, and a layer of $Al_2O_3$ having a thickness of 1 to 5µ is deposited on the matrix surface by a known method of chemical vapor-phase deposition (CVD). As the matrix surface is covered with a nitride, a very strong coated layer of $Al_2O_3$ having a high bonding strength is formed on the matrix without formation of any britle decarburized layer. The nitride layer on the matrix surface, which constitutes one of the important features of the invention, can be formed even if the matrix does not contain any nitride but contains only a carbide of Ti, Ta or Nb. In such a case, however, a considerably long time is required for the formation of a nitride; therefore, the use of a matrix containing no nitride is unsuitable for industrial applications. The $Al_2O_3$ layer on the matrix surface may also be formed by any other known method, such as a PVD method.

DESCRIPTION OF THE PREFERRED EMBODIMENTS

The invention will now be described in further detail with reference to examples. It is, however, to be understood that the scope of the invention is not limited by these examples and is only defined by the claims.

EXAMPLE 1

A tip for a cutting tool conforming to the requirements of Japanese Industrial Standard (JIS) SNGN432TN was prepared from each of the WC-based sintered alloys of different compositions as shown in Table 1. The tips were held at 1,200° C. for two hours in an electic furnace filled with a nitrogen atmosphere whereby a nitride layer having a thickness of 1 to 7µ was formed on the surface of each tip.

The tips were then placed in a stainless steel reactor for chemical deposition and heated to 1,100° C. while a gas mixture containing 59% of $H_2$, 3% of CO and $CO_2$, and 8% of $AlCl_3$ was supplied thereinto at a pressure of 20 Torr for two hours whereby a layer of $Al_2O_3$ was deposited on each tip. Each tip was then cut along a cross section. Examination thereof through a microscope revealed a nitride layer and a layer of $Al_2O_3$ surrounding the nitride layer. The thickness of the nitride and $Al_2O_3$ layers were as shown in Table 2. There was no void between the matrix and the nitride layer and they were bonded to each other very firmly by a carbo-nitride. No decarburized layer was found in the matrix. A layer containing virtually no Ti, Ta or Nb was found in a region having a thickness of 10 to 20µ inwardly of the nitride layer. This layer was found to be superior in thermal conductivity and strength to any layer containing Ti or Ta and it thereby contributed to reinforcing the matrix to a greater degree than in an ordinary coated tip. The tips were subjected to cutting tests under the following conditions with results obtained as shown in Table 3:

Conditions for Continuous Cutting Tests

Material to be cut: 140 mm dia., 200 mm long piece of FC20;
Cutting speed: 130 m/min.;
Bite and feed: 1.0 mm and 0.31 mm, respectively;
Tool; SNGN432TN (JIS);
Cutting time: 10 min.

TABLE 1

| Matrix | WC | TiN | TaN | NbN | TiC | TaC | $Mo_2C$ | Ni | Co |
|---|---|---|---|---|---|---|---|---|---|
| A | 64 | 15 | — | — | 5 | 5 | 2 | 6 | 3 |
| B | 70 | 10 | — | — | 10 | — | 2 | 8 | — |
| C | 80 | 5 | — | — | — | 5 | 2 | 4 | 4 |
| D | 89 | 3 | 2 | — | — | — | — | — | 6 |
| E | 89 | 3 | — | 2 | — | — | — | — | 6 |

TABLE 2

| Matrix | Inner nitride layer ($\mu$) | Outer $Al_2O_3$ layer ($\mu$) |
|---|---|---|
| A | 7 | 1.5 |
| B | 4 | 1.5 |
| C | 3 | 1.5 |
| D | 1.5 | 1.5 |
| E | 1.6 | 1.5 |

TABLE 3

| Matrix | Flank wear (mm) | Crater wear (mm) | Remarks |
|---|---|---|---|
| A | 0.24 | 8 | Invention |
| B | 0.19 | 11 | Invention |
| C | 0.15 | 10 | Invention |
| D | 0.13 | 12 | Invention |
| E | 0.13 | 13 | Invention |
| B' | 0.56 | 210 | Comparative example-matrix B alone |
| B'' | 0.31 | 41 | Comparative example-matrix B only nitrided |
| Commercially coated alloy | 0.20 | 40 | Comparative example-coated with multiple TiN and TiC layers |
| Commercially coated alloy | 0.21 | 18 | Comparative example-coated with multiple TiN and TiC layers |

EXAMPLE 2

Tips prepared from matrixes B, B' and B'' as employed in Example 1 and a tip B''' prepared by application of $Al_2O_3$ as described in Example 1 were subjected to cutting tests under the following conditions with results obtained as shown in Table 4:

Test Conditions

Machine used: Milling machine;
Cutter: Double-negative type ($-6°$ and $-5°$);
Material to be cut: 100 mm square piece of SCM4 (HRC 33);
Cutting speed: 177 m/min.;
Bite: 2 mm;
Feed: 0.26 mm/cutting edge;
Life evaluation: Based on the length of time for which the cutting edge could be used without chipping.

TABLE 4

| | Life (min.) |
|---|---|
| B | 14.0 |
| B' | 12.0 |
| B'' | 12.2 |
| B''' | 4.2 |

As is clear from the results of Examples 1 and 2, the tips of the invention obtained by heat treating the matrix and coating it with $Al_2O_3$ generally showed a lower degree of flank wear than the prior art type tips, and a crater wear was obtained which was half or less that observed in known tips or less. Moreover, the coated tips of the invention did not chip for a longer period of time. These advantages of the tips produced according to the invention are attributable to the coated layer of high bonding strength formed on the strong matrix surface as hereinbefore described.

What is claimed is:

1. A method of making a coated tip for cutting purposes, comprising the steps of heat treating a WC-based ultrahard alloy containing WC, at least one nitride selected from the group consisting of TiN, TaN and NbN, and a bonding metal at a temperature of 800° C. to 1,300° C. ; in an atmosphere containing nitrogen for a sufficient time to cause said nitride in a layer in the vicinity of the surface of said alloy to move to said surface to form a layer of said nitride on said surface and to form an alloy layer of said WC and said bonding metal in which said nitride has been reduced; and coating said surface with a layer of $Al_2O_3$.

2. The method of making a coating tip for cutting purposes as set forth in claim 1, wherein said nitride layer has a thickness 1 to 8$\mu$, said $Al_2O_3$ layer has a thickness of 1 to 5$\mu$, and said nitride and Alhd $2O_3$ layers have a total thickness of 2 to 10$\mu$.

3. The method of making a coating tip for cutting purposes as set forth in claim 1 or 2, wherein said step of coating said surface with a layer of $Al_2O_3$ comprises CVD deposition.

4. A method of making a coated tip for cutting purposes, comprising the steps of heat treating a WC-based ultrahard alloy containing WC, at least one nitride selected from the group consisting of TiN, TaN and NbN, and a bonding metal at a temperature of approximately 1,200° C. for approximately 2 hours in a nitrogen atmosphere to form a nitride layer having a thickness of 1 to 7$\mu$ on the surface of said tip; placing said tip in a reaction chamber; and heating set tip in said reaction chamber to a temperature of approximately 1,100° C. while supplying a gas mixture containing approximately 59% of $H_2$, 3% of Co and $Co_2$, and 8% of $AlCl_3$ at a pressure of approximately 20 Torr of approximately 2 hours.

* * * * *